US012620564B2

(12) United States Patent
Heo

(10) Patent No.: US 12,620,564 B2
(45) Date of Patent: May 5, 2026

(54) SEMICONDUCTOR SUBSTRATE PROCESSING APPARATUS

(71) Applicant: Samsung Electronics Co., Ltd., Suwon-si (KR)

(72) Inventor: Daewoong Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 617 days.

(21) Appl. No.: 18/147,775

(22) Filed: Dec. 29, 2022

(65) Prior Publication Data

US 2023/0395358 A1      Dec. 7, 2023

(30) Foreign Application Priority Data

Jun. 7, 2022      (KR) ........................ 10-2022-0068731

(51) Int. Cl.
*H01J 37/32*          (2006.01)
*B08B 7/00*          (2006.01)

(52) U.S. Cl.
CPC ...... *H01J 37/32715* (2013.01); *B08B 7/0035* (2013.01); *H01J 2237/2007* (2013.01); *H01J 2237/201* (2013.01); *H01J 2237/20214* (2013.01); *H01J 2237/20278* (2013.01); *H01J 2237/335* (2013.01)

(58) Field of Classification Search
USPC ...................................... 156/345.55; 118/730
See application file for complete search history.

(56) References Cited

U.S. PATENT DOCUMENTS

| | | | | |
|---|---|---|---|---|
| 4,926,793 A | * | 5/1990 | Arima | ............... C23C 16/45508 |
| | | | | 118/728 |
| 5,125,359 A | * | 6/1992 | Barale | ................... C23C 16/455 |
| | | | | 118/728 |
| 10,822,694 B2 | | 11/2020 | Chung et al. | |

FOREIGN PATENT DOCUMENTS

| | | | | | |
|---|---|---|---|---|---|
| CN | 212247177 U | | 12/2020 | | |
| CN | 212370736 U | | 1/2021 | | |
| CN | 213968028 U | | 8/2021 | | |
| CN | 214068685 | * | 8/2021 | ............. | H01J 37/20 |
| CN | 214068685 U | | 8/2021 | | |
| CN | 215142932 U | | 12/2021 | | |
| JP | 2020031176 A | | 2/2020 | | |
| KR | 20220012152 A | | 2/2022 | | |

* cited by examiner

*Primary Examiner* — Ram N Kackar

(74) *Attorney, Agent, or Firm* — Wolf, Greenfield & Sacks, P.C.

(57)          ABSTRACT

A semiconductor substrate processing apparatus includes a chamber dimensioned to accommodate a plurality of strip magazines, each strip magazine configured to receive a plurality of substrates therein, a plasma generator coupled to the chamber and configured to generate plasma used to remove foreign substances on the substrates in the chamber, and a rotation support mechanism configured to rotate the plurality of strip magazines within the chamber. Each of the strip magazines includes first and second side wall plates, an upper plate and a lower plate, and a plurality of guides on inner sides of the first and second side wall plates to support the substrates. The rotation support mechanism includes: a shaft, a motor configured to rotate the shaft, and a plurality of support frames fixed to side surfaces of the shaft and configured to fixedly support the strip magazines.

20 Claims, 11 Drawing Sheets

10

30

20

50  S      P    ~100

22

24

Z DIRECTION

Y DIRECTION
X DIRECTION

<u>10</u>

Z DIRECTION

Y DIRECTION

X DIRECTION

Y DIRECTION

Z DIRECTION  X DIRECTION

Z DIRECTION

X DIRECTION

Y DIRECTION

Z DIRECTION

Y DIRECTION

X DIRECTION

Z DIRECTION

Y DIRECTION

X DIRECTION

SEMICONDUCTOR SUBSTRATE PROCESSING APPARATUS

PRIORITY STATEMENT

This application claims priority under 35 U.S.C. § 119 to Korean Patent Application No. 10-2022-0068731, filed on Jun. 7, 2022 in the Korean Intellectual Property Office (KIPO), the contents of which are herein incorporated by reference in their entirety.

FIELD

Example embodiments relate to a semiconductor substrate processing apparatus. More particularly, example embodiments relate to a semiconductor substrate processing apparatus for performing a plasma cleaning process on a semiconductor substrate.

BACKGROUND

Before proceeding with a wire bonding process for connecting conductive wires between semiconductor devices, a plasma cleaning process in which plasma is applied on a semiconductor substrate for a predetermined time in a plasma chamber may be performed to remove an oxide film, foreign substances, and the like on the semiconductor substrate. Bond ability between a bond finger of the semiconductor substrate and a gold wire may be improved through the plasma cleaning process. Since the plasma cleaning process is performed by irradiating electron ions on the semiconductor substrate held on a strip magazine, the oxide film and the foreign substances of the semiconductor substrate provided in the strip magazine may not be removed. When a sufficient cleaning effect is not obtained, there may be a problem in that an adhesive force between the bond finger of the semiconductor substrate and the wiring is lowered.

SUMMARY

Example embodiments provide a semiconductor substrate processing apparatus including a rotation support mechanism that rotates a strip magazine provided with a semiconductor substrate in a plasma chamber.

According to example embodiments, a semiconductor substrate processing apparatus includes a chamber dimensioned to accommodate a plurality of strip magazines, each strip magazine configured to receive a plurality of substrates therein, a plasma generator coupled to the chamber and configured to generate plasma used to remove foreign substances on the substrates in the chamber, and a rotation support mechanism configured to rotate the plurality of strip magazines within the chamber. Each of the strip magazines includes first and second side wall plates facing each other, an upper plate and a lower plate, and a plurality of guides on inner sides of the first and second side wall plates to support the substrates disposed between the first and second side wall plates. The rotation support mechanism includes: a shaft extending in a vertical direction in the chamber, a motor configured to rotate the shaft, and a plurality of support frames fixed to side surfaces of the shaft and configured to fixedly support the strip magazines.

According to example embodiments, a semiconductor substrate processing apparatus includes a chamber dimensioned to provide a space in which a plasma cleaning process is performed, a motor on a lower wall of the chamber, a shaft rotatably connected to the motor and extending in a vertical direction in the chamber, a plurality of support frames detachably fixed to side surfaces of the shaft and fixedly supporting a plurality of strip magazines each loaded with a plurality of substrates, and a plasma generator configured to generate plasma in the chamber for removing foreign substances on the substrates. Each of the strip magazines includes first and second side wall plates facing each other, an upper plate and a lower plate, and a plurality of guides on inner sides of the first and second side wall plates to support the substrates between the first and second side wall plates, and each of the strip magazines includes an open end into which the substrates are inserted or removed, and the open end of the strip magazine faces a direction parallel to or perpendicular to the side surface of the shaft to which the support frame supporting the strip magazine is fixed.

According to example embodiments, a semiconductor substrate processing apparatus includes a chamber configured to provide a space for accommodating a plurality of strip magazines that each accommodate a plurality of substrates therein, a plasma generator configured to generate a plasma for removing foreign substances on the substrates in the chamber, and a rotation support mechanism configured to rotate the strip magazines within the chamber such that ions of the plasma are uniformly applied on the substrates. Each of the strip magazines includes first and second side wall plates facing each other, an upper plate and a lower plate, and a plurality of guides on inner sides of the first and second side wall plates to support the substrates loaded between the first and second side wall plates. The rotation support mechanism includes: a shaft extending vertically within the chamber and including at least one keyway on a side surface of the shaft, a motor configured to rotate the shaft, a bearing provided between the shaft and the motor to transmit a rotational force generated from the motor to the shaft, and at least one support frame fixed to the side surface of the shaft, fixedly supporting each of the strip magazines, and including a key for connecting to or disconnecting from the at least one keyway.

According to example embodiments, a semiconductor substrate processing apparatus may include a chamber configured to provide a space for accommodating a plurality of strip magazines that each accommodate a plurality of substrates therein, a plasma generator configured to generate plasma for removing foreign substances on the substrates in the chamber, and a rotation support mechanism configured to rotate the strip magazines within the chamber such that ions of the plasma are uniformly applied on the substrates. Each of the strip magazines includes first and second side wall plates facing each other, an upper plate and a lower plate, and a plurality of guides on inner sides of the first and second side wall plates to support the substrates disposed between the first and second side wall plates. The rotation support mechanism includes: a shaft extending in a vertical direction within the chamber, a motor configured to rotate the shaft, and a plurality of support frames respectively fixed to side surfaces of the shaft and fixedly supporting the strip magazines.

Thus, the rotation support mechanism in the chamber may rotate the strip magazine provided with the substrates and may provide centrifugal force to the strip magazine. The centrifugal force may physically remove the foreign substances (e.g., dust) remaining inside or on the substrate. The foreign substances having a high mass may move toward an edge of the substrate through the centrifugal force, and the substrate may obtain a physical cleaning effect. In addition, the rotation support mechanism may rotate the strip magazine to evenly apply ions of the plasma on the substrate and increase a chemical cleaning effect.

BRIEF DESCRIPTION OF THE DRAWINGS

Example embodiments will be more clearly understood from the following detailed description taken in conjunction with the accompanying drawings. FIGS. 1 to 11 represent non-limiting, example embodiments as described herein.

FIG. 1 is a sectional front view illustrating a semiconductor substrate processing apparatus in accordance with example embodiments.

FIG. 2 is a perspective view illustrating a strip magazine in FIG. 1.

FIG. 3 is a front view illustrating a rotation support mechanism configured to rotate a strip magazine in FIG. 1.

FIG. 4 is a plan view illustrating the rotation support mechanism in FIG. 3.

FIG. 5 is a cross-sectional view taken along the line A-A' in FIG. 3.

FIG. 6 is a perspective view illustrating a support frame in FIG. 3.

FIG. 7 is a front view illustrating a rotation support mechanism having support frames of a modified shape in accordance with example embodiments.

FIGS. 8 and 9 are perspective views illustrating support frames in FIG. 7.

FIG. 10 is a front view illustrating a rotational support mechanism having support frames in a modified arrangement in accordance with example embodiments.

FIG. 11 is a plan view illustrating a rotation support mechanism in FIG. 10.

DETAILED DESCRIPTION

Hereinafter, example embodiments will be explained in detail with reference to the accompanying drawings.

Figure 1:
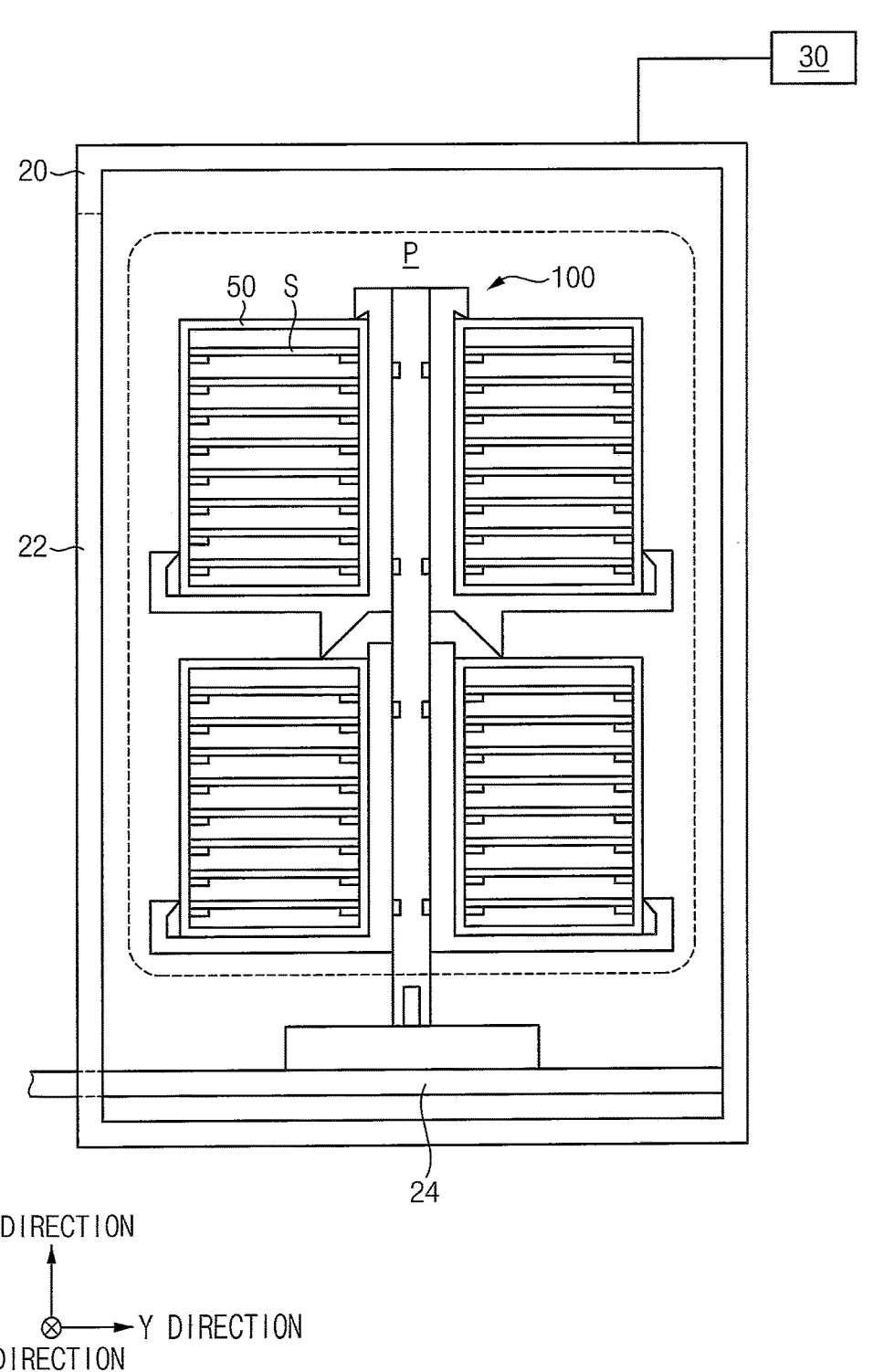
Figure 2:
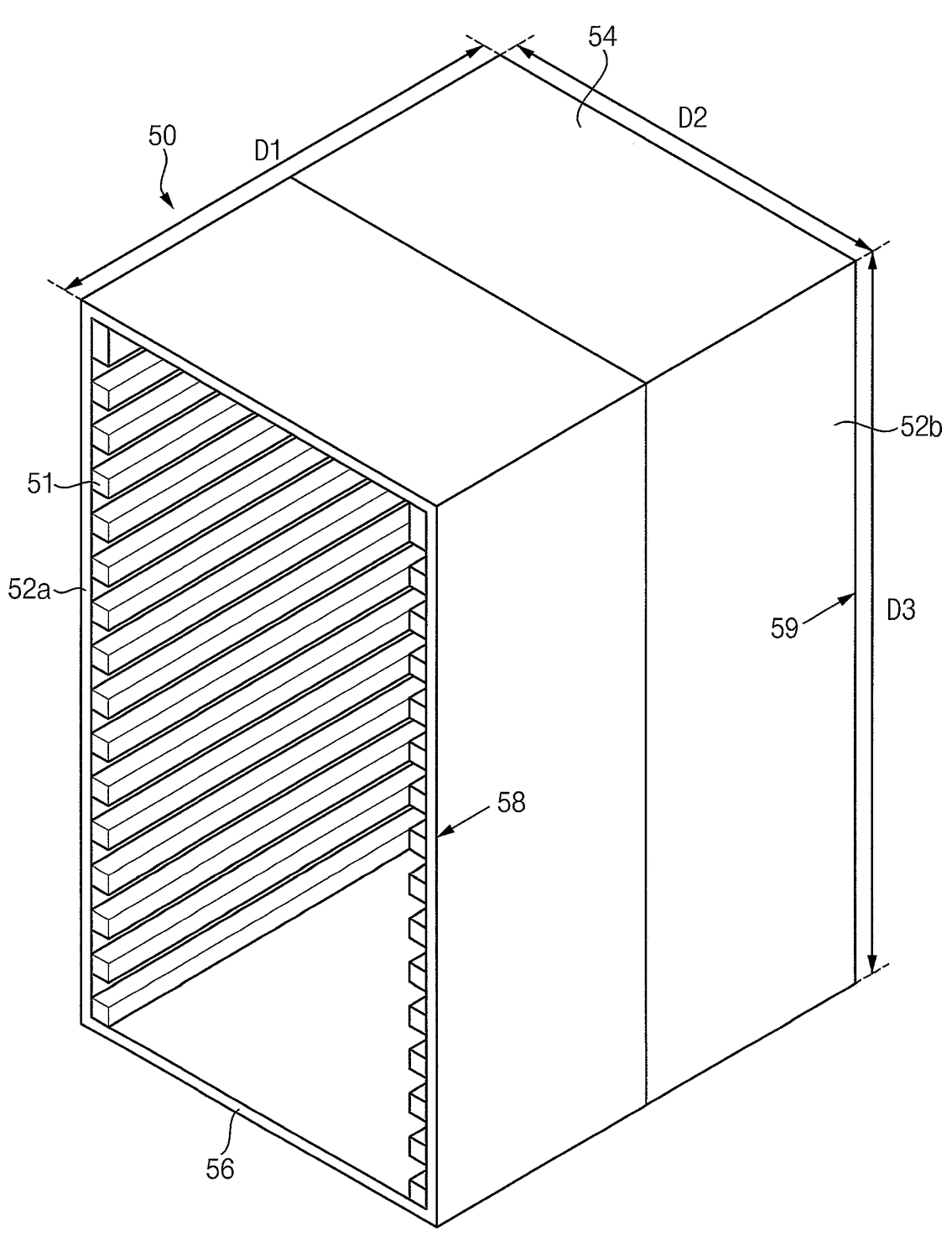

FIG. 1 is a sectional front view illustrating a semiconductor substrate processing apparatus in accordance with example embodiments. FIG. 2 is a perspective view illustrating a strip magazine in FIG. 1.

Referring to FIGS. 1 and 2, a semiconductor substrate processing apparatus 10 may include a chamber 20 configured to provide a space for performing a plasma process on a plurality of substrates S, a plasma generator 30 configured to generate plasma P for performing the plasma process, and a rotation support mechanism 100 configured to rotate a strip magazine that supports the plurality of substrates S in the chamber 20. The semiconductor substrate processing apparatus 10 may further include a gas supply configured to supply a gas into the chamber 20.

The semiconductor substrate processing apparatus 10 may be an apparatus that performs a plasma cleaning process to remove an oxide film, foreign substances, etc. on a substrate S, e.g., a printed circuit board (PCB) disposed in the chamber 20. The semiconductor substrate processing apparatus 10 may not be necessarily limited to a cleaning apparatus. For example, the semiconductor substrate processing apparatus 10 may include a deposition apparatus, an etching apparatus, etc. Here, the substrate S may include a semiconductor substrate, a semiconductor wafer, a glass substrate, etc.

The plasma cleaning process may be referred to as a chemical process in which electromagnetic energy is applied to at least one precursor gas or precursor vapor to convert the precursor into reactive plasma. The plasma cleaning process may be used to remove the oxide film, the foreign substances, and the like on semiconductor devices such as the substrate S. For example, the plasma cleaning process may include argon (Ar) plasma cleaning, nitrogen (N2) plasma cleaning, and the like.

For example, the plasma cleaning process may be performed on the semiconductor devices on which a die attach process, a flip chip bonding process, a curing process, and the like have been performed. The plasma cleaning process may be performed before performing a wire bonding process for connecting the semiconductor devices to each other.

In example embodiments, the chamber 20 may provide an enclosed space that accommodating a plurality of strip magazines 50 in which a plurality of substrates S are received, respectively, and the plasma cleaning process may be performed on the plurality of substrates S in the enclosed space. The chamber 20 may be a cylindrical vacuum chamber. The chamber 20 may include a metal such as aluminum or stainless steel. For example, chamber 20 may include a plasma processing chamber with tuning electrodes for enhanced processing rate and plasma profile uniformity.

A gate 22 for entry and exit of the rotation support mechanism 100 may be installed in a side wall of the chamber 20. Rails 24 for sliding the rotation support mechanism 100 may be provided on a bottom of the chamber 20. The rotation support mechanism 100 may be provided on a plate that slides along the rails 24 such that the rotation support mechanism 100 is loaded and unloaded into and from the chamber 20. The strip magazine 50 with the plurality of substrates S provided thereon may be provided on the rotation support mechanism 100 and may enter and exit the chamber 20 through the gate 22.

In some embodiments, an exhaust port may be installed in a side wall of the chamber 20, and an exhaust portion may be connected to the exhaust port through an exhaust pipe. The exhaust portion may include a vacuum pump such as a turbo molecular pump to adjust a processing space inside the chamber 20 to a pressure of a desired degree of vacuum. The exhaust portion may maintain a constant pressure inside the chamber 20. In addition, process by-products and residual process gases generated in the chamber 20 may be discharged through the exhaust port.

In example embodiments, the gas supply may provide a cleaning gas for generating the plasma P in order to remove the process by-products inside the chamber 20.

For example, the gas supply may include gas supply pipes, a flow controller and a gas supply source, as gas supply elements. The gas supply pipes may supply various gases to upper portion and/or side portions of the chamber 20. The gas supplied by the gas supply pipes may be injected into the chamber 20 through a shower head. The shower head may directly inject various gases into the plasma space in the chamber 20.

The gas supply may supply different gases at a desired ratio. The gas supply source may store a plurality of gases, and the gases may be supplied through a plurality of gas lines respectively connected to the gas supply pipes. The flow controller may control supply flow rates of gases introduced into the chamber 20 through the gas supply pipes. The flow controller may control supply flow rates of the shower head. For example, the gas supply source may include a plurality of gas tanks, and the flow controller may include a plurality of mass flow controllers (MFCs) respectively corresponding to the gas tanks. The mass flow controllers may independently control the supply flow rates of the gases.

In example embodiments, the plasma generator 30 may generate the plasma P for removing the foreign substances on the substrates S in the chamber 20. For example, the plasma P generated by the plasma generator 30 may include a capacitive coupled plasma (CCP), an inductively coupled plasma (ICP), a microwave plasma, etc.

In example embodiments, the strip magazine 50 may receive the substrates S therein. As seen in FIG. 2, the strip magazine 50 may include first and second side wall plates or side walls 52*a* and 52*b* facing each other, an upper plate or upper wall 54 and a lower plate or lower wall 56. The strip magazine 50 may include an open front side or front opening 58 and an open rear side or rear opening 59. The strip magazine 50 may further include a plurality of guides 51 that are respectively provided on inner sides of the first and second side wall plates 52*a* and 52*b* and support the substrates S disposed between the first and second side wall plates 52*a* and 52*b*. The strip magazine 50 may be moved into the chamber 20 to perform the plasma cleaning process while being securely supported on the rotation support mechanism 100. The substrate may be a strip on which a semiconductor package manufacturing process is performed.

The strip magazine 50 may serve as a carrier that receives the plurality of substrates S therein for the semiconductor package manufacturing process. The substrates S may be loaded and unloaded on the guides 51 of the strip magazine 50. The substrate S may be loaded and unloaded into and from the strip magazine 50 by an automated process by a loader and unloader, e.g., a pusher and a gripper.

The strip magazine 50 may include a metallic material such as stainless steel (Fe). Accordingly, because the strip magazine 50 has strong hardness and high toughness, when the strip magazine 50 accommodates the strip such as the substrate S, the strip magazine 50 may protect the strip from external impact.

The strip magazine 50 may include a material having resistance to chemical reactions. Accordingly, the strip magazine 50 may be directly put into a semiconductor package manufacturing process while accommodating the strips to be used as a carrier. The strip magazine 50 may be individually stored and managed in a state in which the strip is not accommodated. Since the strip magazine 50 has a rectangular parallelepiped shape and structure, the plurality of magazines may be stored in a stacked state.

For example, a transverse length or depth D1 between the front side 58 and the rear side 59 of the strip magazine 50 may be within a range of 200 mm to 300 mm. A longitudinal length or width D2 between the first and second side wall plates 52*a* and 52*b* of the strip magazine 50 may be within a range of 80 mm to 100 mm. A height D3 between the upper plate 54 and the lower plate 56 of the strip magazine 50 may be within a range of 130 mm to 150 mm. The number of substrates S accommodated in one strip magazine 50 may be within a range of 14 to 18.

In example embodiments, the rotation support mechanism 100 may fixedly support the strip magazine 50 that accommodates the substrates S therein. The rotation support mechanism 100 may rotate the strip magazine 50, in which the substrates S are loaded, in the chamber 20. The rotation support mechanism 100 may move slidably on the rails 24 provided in the chamber to be loaded and unloaded into and from the chamber 20. The strip magazine 50 fixedly supported on the rotation support mechanism 100 may enter and exit the chamber 20.

The rotation support mechanism 100 may provide a centrifugal force C (FIG. 4) for separating the foreign substances from the substrates S. As the rotation support mechanism 100 rotates the strip magazine 50 in the chamber

20, the rotation support mechanism 100 may generate the centrifugal force C on the substrates S provided inside the strip magazine 50. The foreign substances may be separated from the substrates S by the centrifugal force C.

The rotation support mechanism 100 may assist in more uniform application of ions of the plasma P on the substrates S. As the rotation support mechanism 100 rotates the strip magazine 50 in the chamber 20, the ions of the plasma P may be more uniformly applied on the substrates S loaded in the strip magazine 50. As the ions of the plasma P are more uniformly applied, the foreign substances on the substrates S may be sufficiently removed by the plasma P.

Hereinafter, the rotation support mechanism 100 that supports and rotates the strip magazine 50 will be described in detail.

Figure 3:
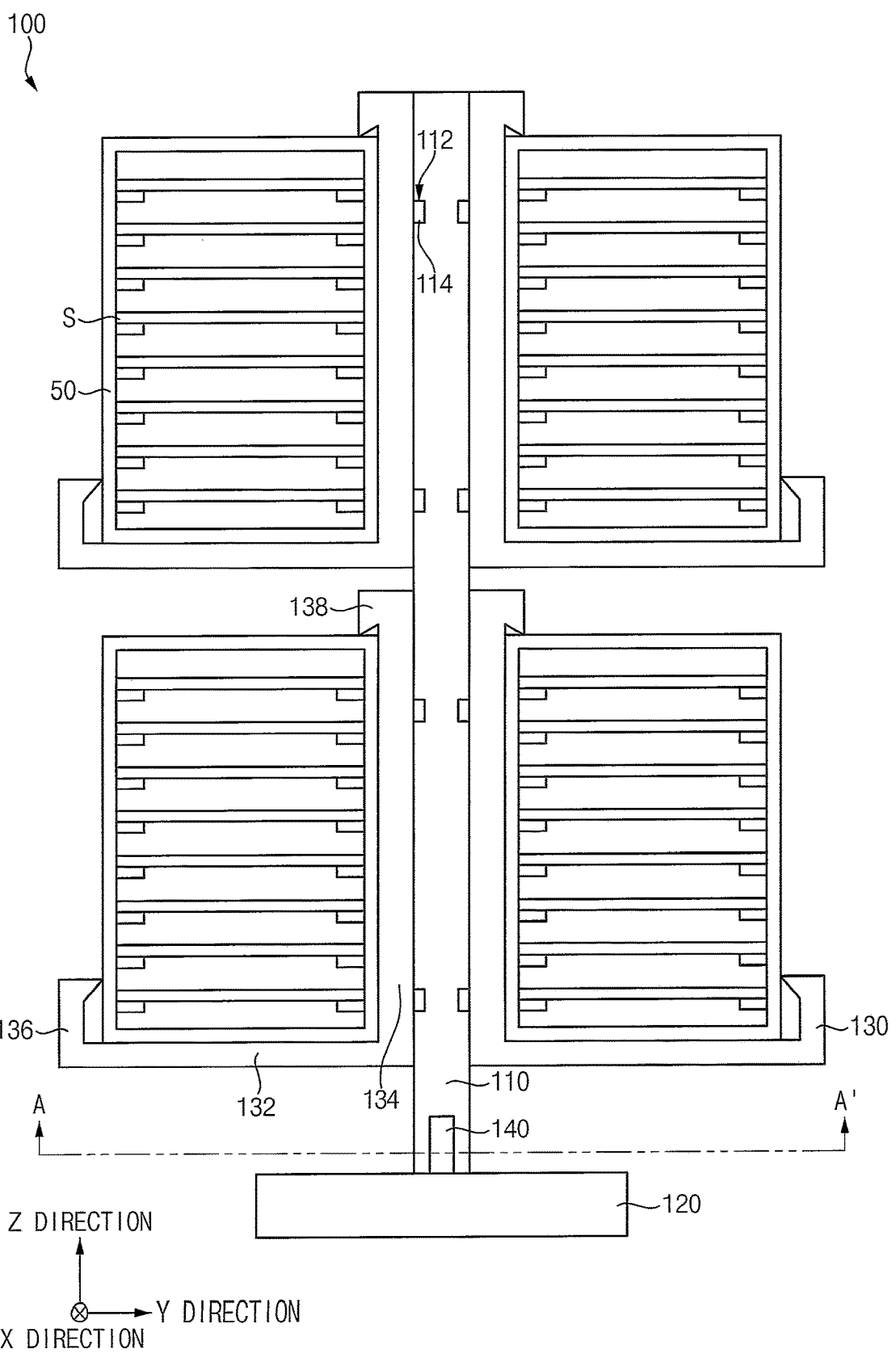
Figure 4:
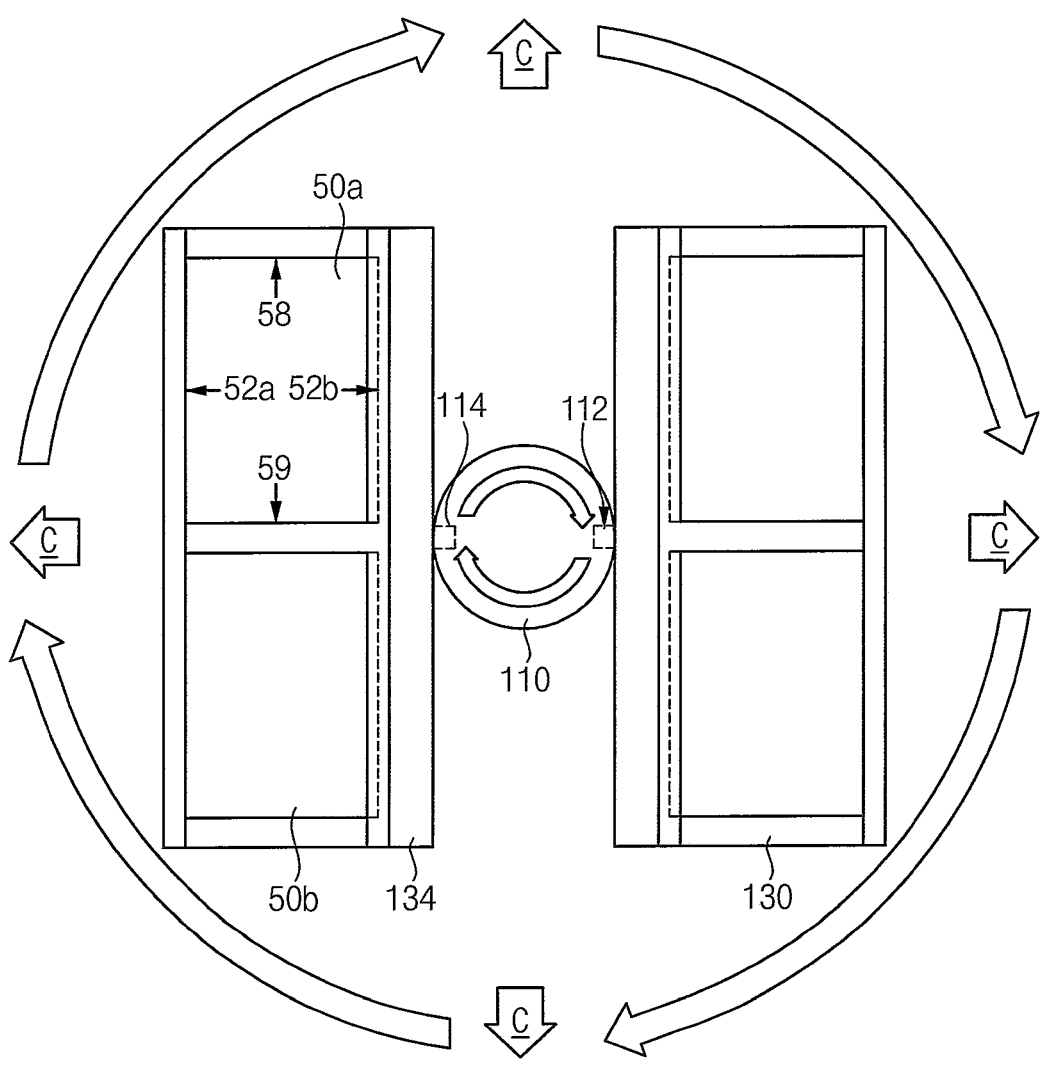
Figure 4:
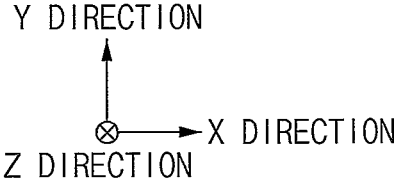
Figure 5:
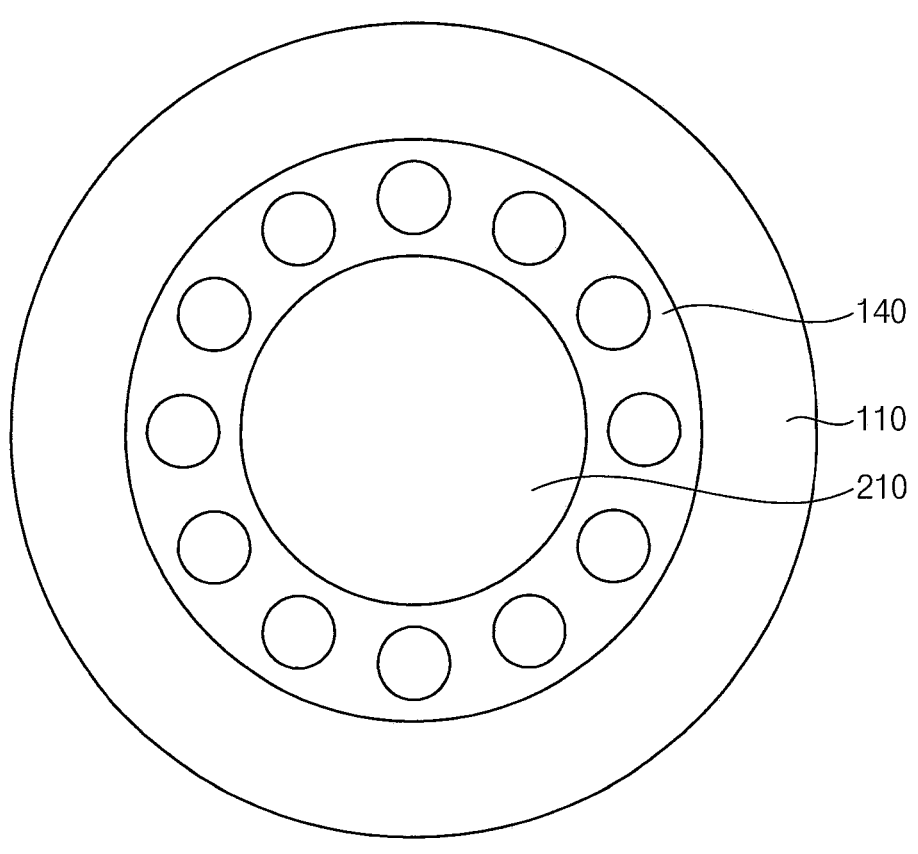
Figure 6:
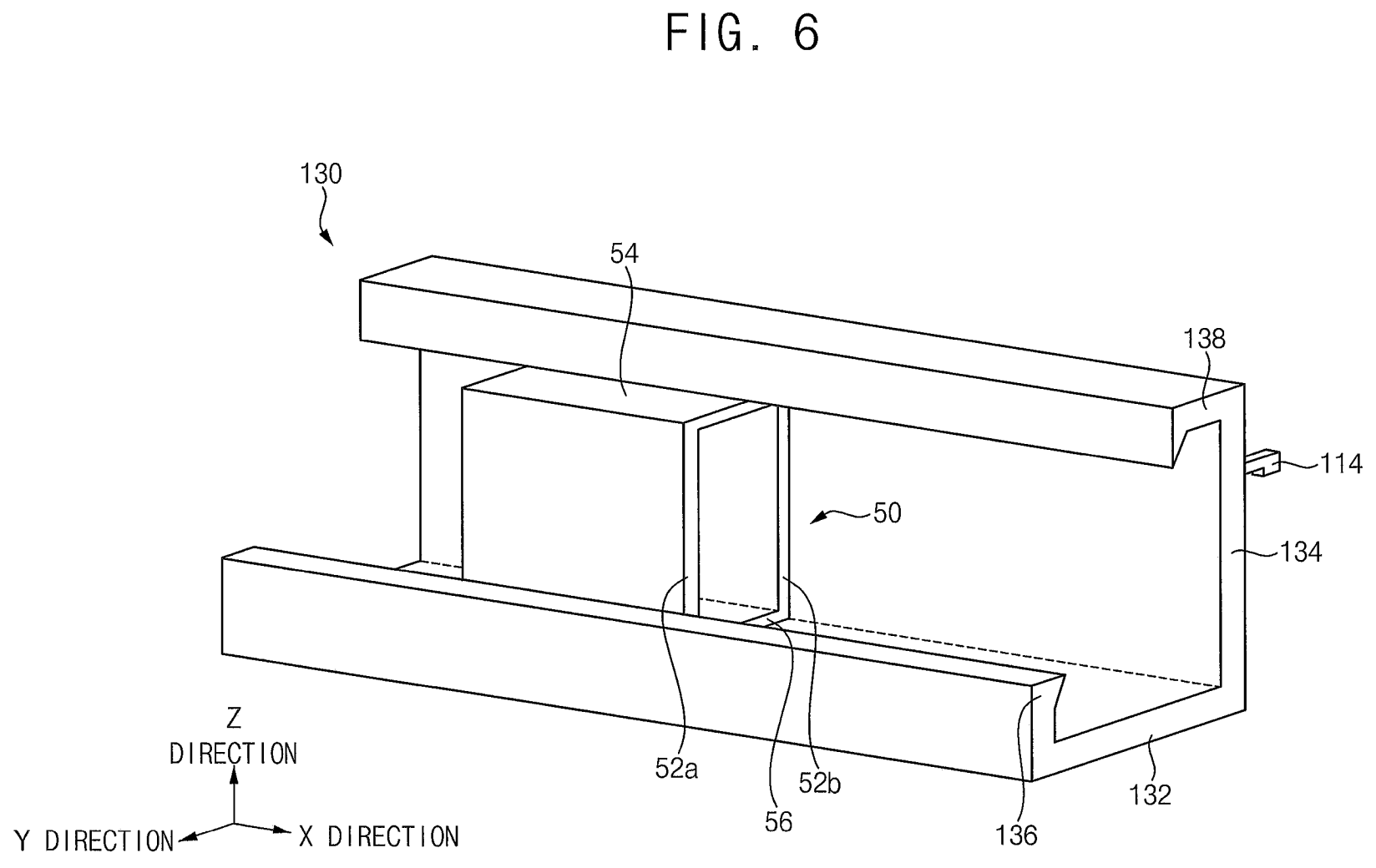

FIG. 3 is a front view illustrating a rotation support mechanism configured to rotate a strip magazine in FIG. 1. FIG. 4 is a plan view illustrating the rotation support mechanism in FIG. 3. FIG. 5 is a cross-sectional view taken along the line A-A' in FIG. 3. FIG. 6 is a perspective view illustrating a support frame in FIG. 3.

Referring to FIGS. 3 to 6, in example embodiments, the rotation support mechanism 100 may include a shaft 110, a motor 120 configured to rotate the shaft 110, and a plurality of support frames 130 that are respectively detachably fixed to side surfaces of the shaft 110 and fixedly support the strip magazines 50 provided with the substrates S respectively. The rotation support mechanism 100 may further include a bearing 140 provided between the shaft 110 and the motor 120. The rotation support mechanism 100 may rotate the shaft 110 through the motor 120, and may rotate the support frames 130 fixed to the shaft 110. The rotation support mechanism 100 may rotate the strip magazine 50 fixedly supported by the support frame 130, and accordingly, the substrates S received in the strip magazine 50 may be rotated.

In example embodiments, the shaft 110 may have a cylindrical shape, a square bar shape, a hexagonal bar shape, an octagonal bar shape, a polygonal bar shape, and the like. The shaft 110 may extend in a vertical direction (Z direction). The shaft 110 may have a groove corresponding to the motor 120 at a lower portion, and may be physically connected to the motor 120 through the groove. The shaft 110 may rotate by a rotational driving force transmitted from the motor 120. The shaft 110 may rotate clockwise or counterclockwise. For example, the shaft 110 may include a metal material such as stainless steel (Fe).

The shaft 110 may include a keyway 112 formed on the side surfaces of the shaft 110 to detachably fix the support frame 130. The keyway 112 may have a structure corresponding to a key 114 of the support frame 130. The shaft 110 may be connected to or detached from the support frame 130 through the keyway 112.

In example embodiments, the motor 120 may transmit the rotational driving force to the shaft 110 to rotate the shaft 110. The motor 120 may be provided under the shaft 110. The motor 120 may be connected to the shaft 110 through a drive shaft, and may support the shaft 110 to be rotatable. The motor 120 may rotate the support frame 130 and the strip magazine 50 that are detachably fixed to the shaft 110 through the rotational driving force. For example, the motor 120 may rotate the shaft 110 within a rotation speed range of 1,200 rpm to 2,500 rpm. The motor 120 may rotate in the clockwise or the counterclockwise direction.

For example, the motor 120 may include a direct drive motor (DDM). The direct drive motor may be a drive motor that transmits power through direct coupling without an intermediate mechanism such as a speed reducer or a belt. Since the motor 120 is directly coupled with the shaft 110 without the intermediate mechanism, a large torque may be transmitted to the shaft 110. The motor 120 may generate the large rotational force through the large torque. The motor 120 may increase a magnitude of the centrifugal force C such that the foreign substances are more easily separated from the substrate S through the large rotational force.

In example embodiments, the bearing 140 may be provided between the shaft 110 and the motor 120. The bearing 140 may reduce a frictional force generated between the shaft 110 and the motor 120. The bearing 140 may stably transmit the rotational force generated by the motor 120 to the shaft 110.

For example, the bearing 140 may include a sleeve bearing, a ball bearing, a roller bearing, a needle roller bearing, a sliding bearing, etc.

In example embodiments, the support frame 130 may be detachably coupled to the shaft 110. The support frame 130 may fixedly support the strip magazine 50 that accommodates the substrates S therein. The support frame 130 may rotate together with the shaft 110 to transmit the rotational force from the shaft 110 to the strip magazine 50. The support frame 130 may fixedly support the strip magazine 50 in order to prevent the strip magazine 50 from being separated from the rotation support mechanism 100 by the centrifugal force C.

For example, one support frame 130 may fixedly support at least one strip magazine 50a, 50b. The plurality of support frames 130 may be respectively detachably fixed to the side surfaces of the shaft 110 in an arrangement in which vertical plates 134 of the support frame 130 face each other. The plurality of support frames 130 may be arranged in a plurality of levels in the vertical direction (Z direction) and may be respectively fixed to the side surfaces of the shaft 110.

The support frame 130 may include the key 114 that is detachably fixed to the shaft 110. The key may have a structure corresponding to the keyway 112 of the shaft 110. The support frame 130 may be connected to or separated from the shaft 110 through the key 114.

As illustrated in FIG. 6, the support frame 130 may include a horizontal plate or lower plate 132 extending in a second horizontal direction (Y direction) and a vertical plate 134 extending in a vertical direction (Z direction) orthogonal to the second horizontal direction (Y direction). The support frame 130 may support the strip magazine 50 fixedly through the horizontal plate 132 and the vertical plate 134. The strip magazine 50 may be inserted in a first horizontal direction (X direction) orthogonal to the second horizontal direction (Y direction) and the vertical direction (Z direction) to be fixedly supported by the support frame 130.

The horizontal plate 132 may support the lower plate 56 at the bottom of the strip magazine 50. The horizontal plate 132 may include a side wall plate fixing portion 136 for pressing and fixing the first side wall plate 52a of the strip magazine 50.

The side wall plate fixing portion 136 may protrude from the horizontal plate 132 in the vertical direction (Z direction) to press the first side wall plate 52a of the strip magazine 50 in the second horizontal direction (Y direction). The side wall plate fixing portion 136 may include a protruding shape or member extending toward the strip magazine 50, and may securely support the strip magazine 50 through the protruding shape. The strip magazine 50 may be stably fixed between the side wall plate fixing portion 136 and the vertical plate 134 such that movement of the strip magazine

50 is limited in the second horizontal direction (Y direction) and the strip magazine 50 is stably fixed on the support frame 130.

The vertical plate 134 may extend in the vertical direction (Z direction) from the horizontal plate 132. The vertical plate 134 may support the second side wall plate 52b of the strip magazine 50. The vertical plate 134 may include an upper plate fixing portion 138 for pressing and fixing the upper plate 54 of the strip magazine 50.

The upper plate fixing portion 138 may protrude from the vertical plate 134 in the second horizontal direction (Y direction) to press the upper plate 54 of the strip magazine 50 in the vertical direction (Z direction). The upper plate fixing portion 138 may include the protruding shape or member extending toward the strip magazine 50, and may securely support the strip magazine 50 through the protruding shape. The strip magazine 50 may be stably fixed between the upper plate fixing portion 138 and the horizontal plate 132 such that the movement of the strip magazine 50 is limited in the vertical direction (Z direction) and the strip magazine 50 is stably fixed on the support frame 130.

Figure 7:
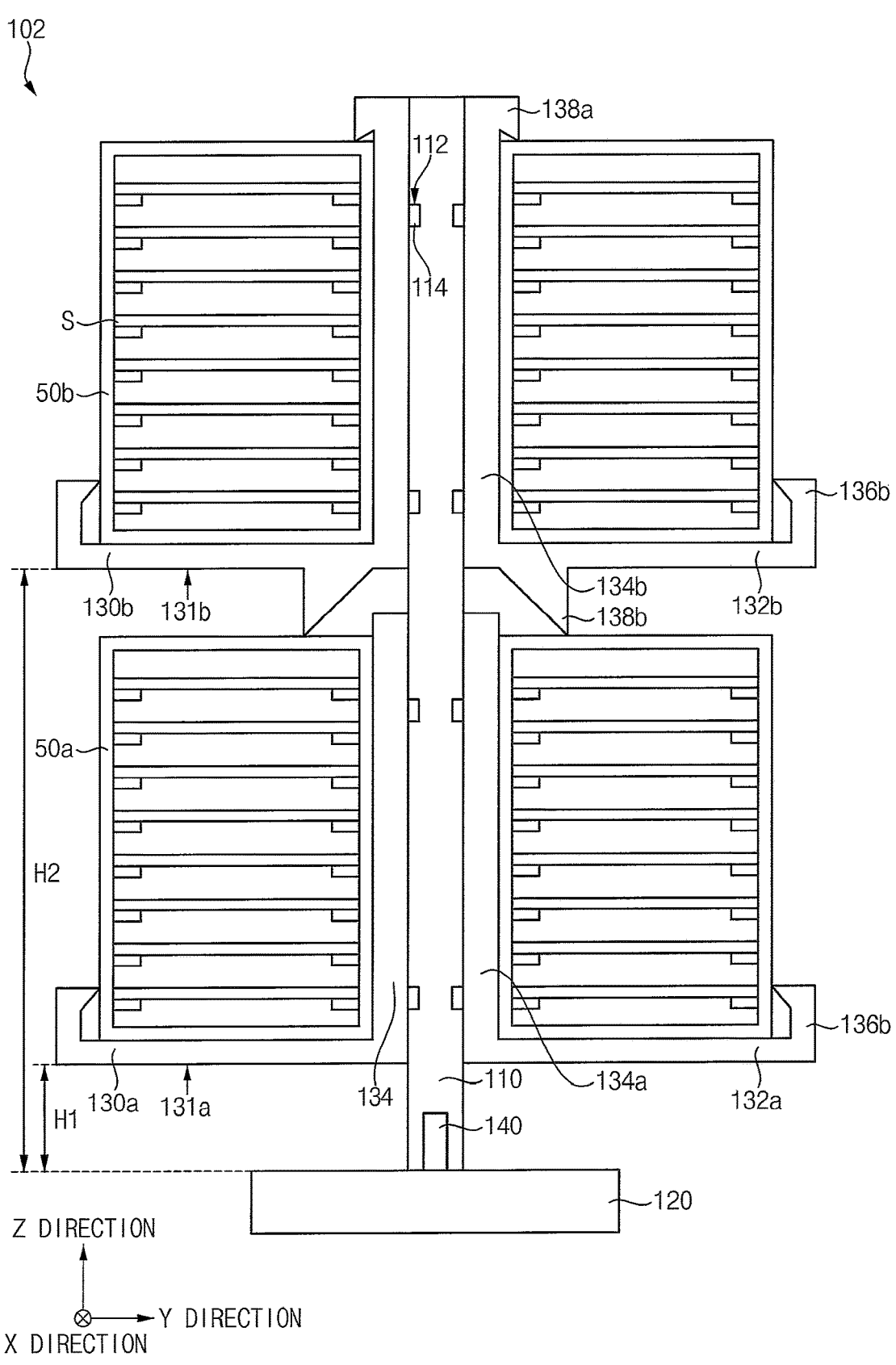
Figure 8:
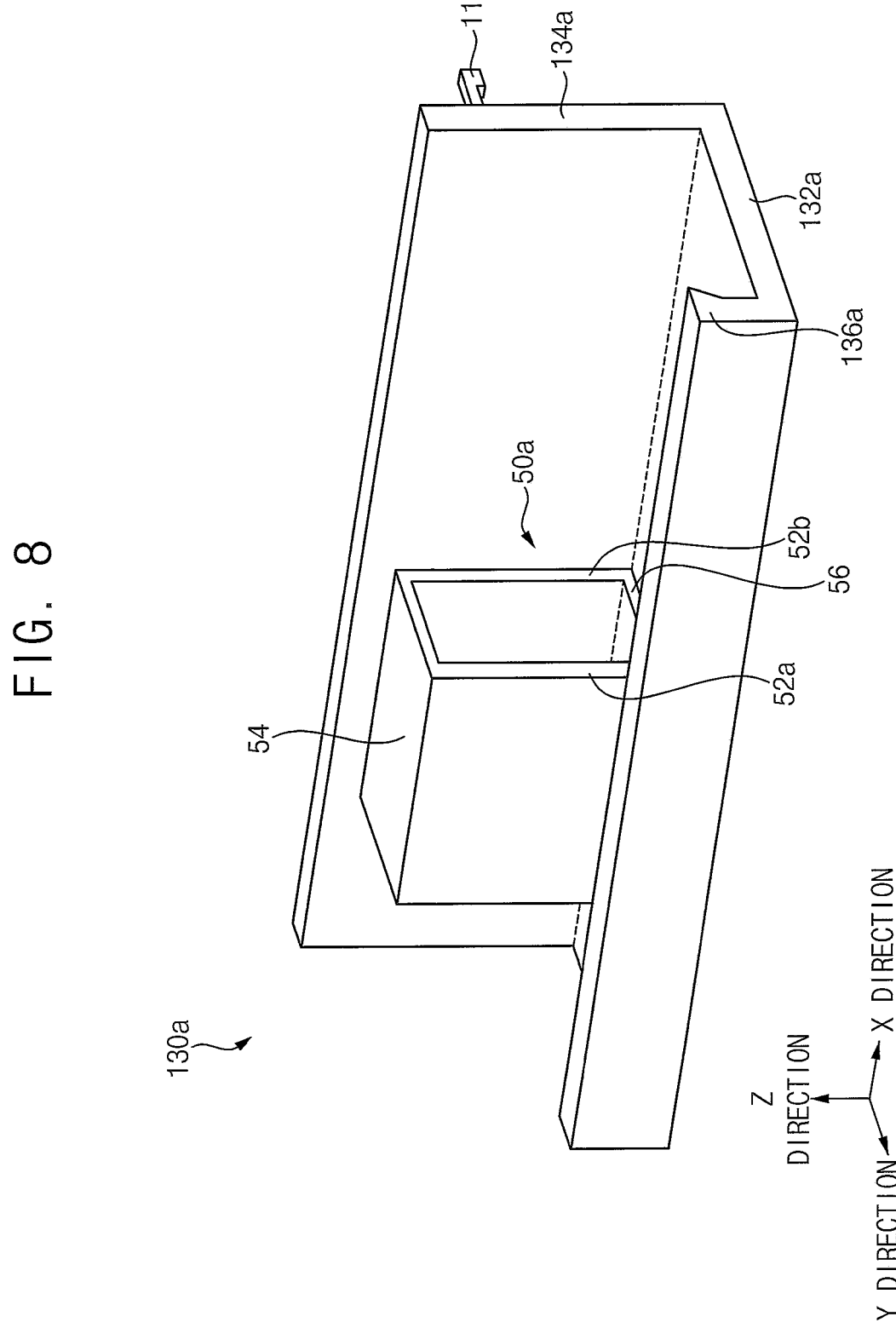
Figure 9:
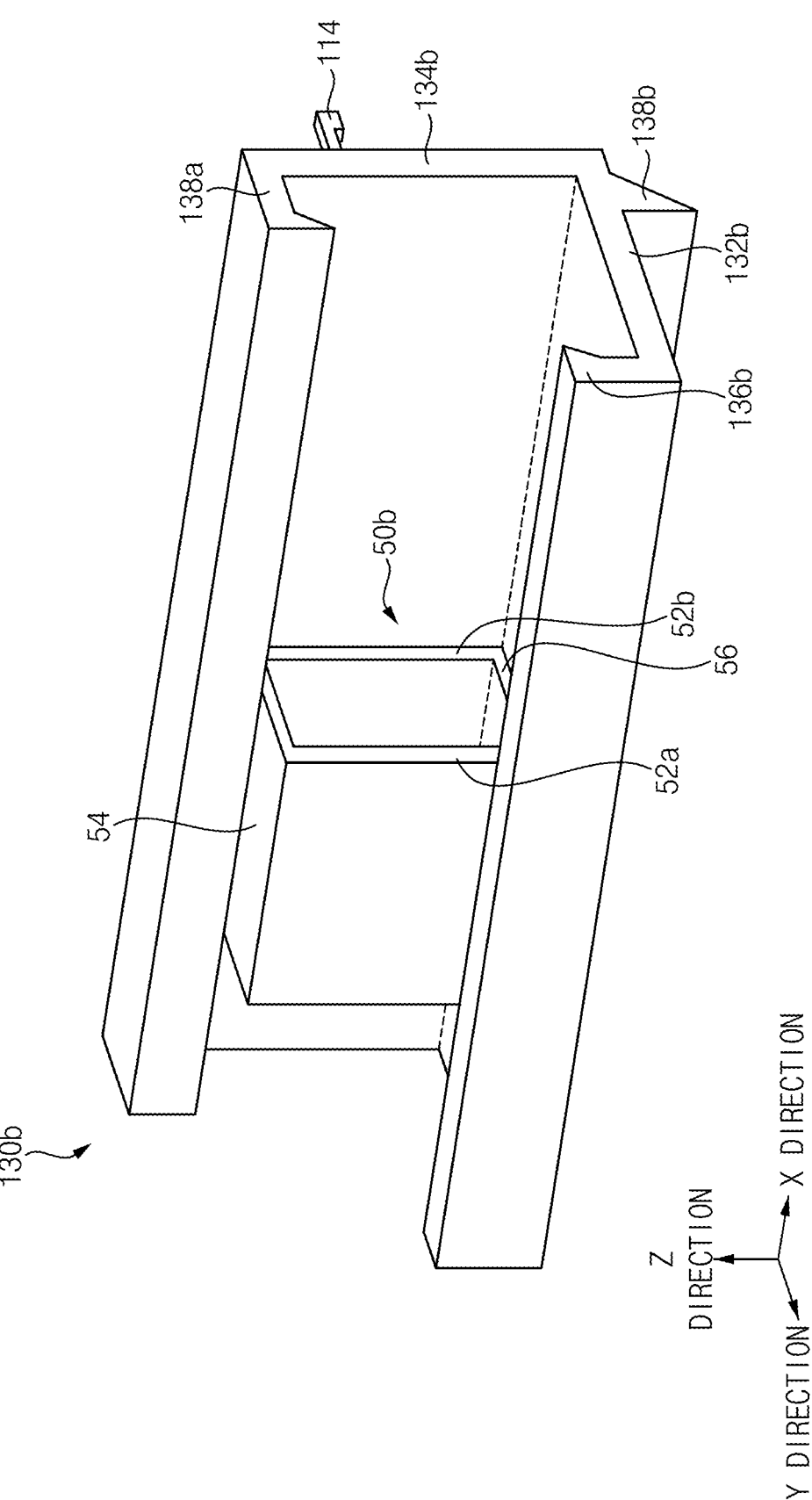

FIG. 7 is a front view illustrating a rotation support mechanism having modified support frames in accordance with example embodiments. FIGS. 8 and 9 are perspective views illustrating the support frames in FIG. 7. The semiconductor substrate processing apparatus may be substantially the same as or similar to the semiconductor substrate processing apparatus described with reference to FIGS. 1 to 6 except for a configuration of the support frames. Thus, same or similar components are denoted by the same or similar reference numerals, and repeated descriptions of the same components may be omitted in the interest of brevity.

Referring to FIGS. 7 to 9, a rotation support mechanism 102 may include the shaft 110, the motor 120 configured to rotate the shaft 110, and a plurality of support frames 130 that are respectively detachably fixed to side surfaces of the shaft 110 and fixedly support the strip magazines 50 provided with the substrates S.

In example embodiments, the support frames 130 may include a first support frame 130a that has lower surface 131a spaced apart from an upper end of the motor 120 by a first distance H1 and a second support frame 130b that has a lower surface 131b spaced apart from the upper end of the motor 120 by a second distance H2 greater than the first distance H1.

A plurality of the first support frames 130a and a plurality of the second support frames 130b may be connected to the shaft 110. The first support frame 130a may be located lower than the second support frame 130b. The first support frame 130a may fix a first strip magazine 50a, and the second support frame 130b may fix a second strip magazine 50b.

As illustrated in FIG. 8, the first support frame 130a may include a first horizontal plate 132a extending in the second horizontal direction (Y direction) and a first vertical plate 134a extending in the vertical direction (Z direction). The first support frame 130a may support the first strip magazine 50a through the first horizontal plate 132a and the first vertical plate 134a. The first vertical plate 134a may support the second side wall plate 52b of the first strip magazine 50a.

The first horizontal plate 132a may support the lower plate 56 of the first strip magazine 50a. The first horizontal plate 132a may include a first side wall plate fixing portion 136a for pressing and fixing the first side wall plate 52a of the first strip magazine 50a.

The first side wall plate fixing portion 136a may press the first side wall plate 52a of the first strip magazine 50a in the second horizontal direction (Y direction) by protruding from the first horizontal plate 132*a* in the vertical direction (Z direction). The first side wall plate fixing portion 136*a* may include the protruding shape or member extending toward the first strip magazine 50*a*, and may securely support the first strip magazine 50*a* through the protruding shape. The first strip magazine 50*a* may be stably fixed between the first side wall plate fixing portion 136*a* and the first vertical plate 134*a* such that movement of the first strip magazine 50*a* is limited in the second horizontal direction (Y direction) and the first strip magazine 50*a* is stably fixed on the first support frame 130*a*.

As illustrated in FIG. 9, the second support frame 130*b* may include a second horizontal plate 132*b* extending in the second horizontal direction (Y direction) and a second vertical plate 134*b* extending in the vertical direction (Z direction). The second support frame 130*b* may support the second strip magazine 50*b* through the second horizontal plate 132*b* and the second vertical plate 134*b*.

The second horizontal plate 132*b* may support the lower plate 56 of the second strip magazine 50*b*. The second horizontal plate 132*b* may include a second side wall plate fixing portion 136*b* for pressing and fixing the first side wall plate 52*a* of the second strip magazine and a second upper plate fixing portion 138*b* for pressing and fixing the upper plate 54 of the first strip magazine 50*a* fixed to the first supporting frame 130*a*.

The second side wall plate fixing portion 136*b* may press the first side wall plate 52*a* of the second strip magazine 50*b* in the second horizontal direction (Y direction) by protruding from the second horizontal plate 132*b* in the vertical direction (Z direction). The second side wall plate fixing portion 136*b* may include the protruding shape or member extending toward the second strip magazine 50*b*, and may securely support the second strip magazine 50*b* through the protruding shape. The second strip magazine 50*b* may be fixed between the second side wall plate fixing portion 136*b* and the second vertical plate 134*b* such that movement of the second strip magazine 50*b* is limited in the second horizontal direction (Y direction) and the second strip magazine 50*b* is stably fixed on the second support frame 130*b*.

The second upper plate fixing portion 138*b* may press the upper plate 54 of the first strip magazine 50*a* in the vertical direction (Z direction) by protruding from the second horizontal plate 132*b* in the vertical direction (Z direction). Since the first support frame 130*a* is positioned lower than the second support frame 130*b*, the second upper plate fixing portion 138*b* may press the upper plate 54 of the first strip magazine 50*a* fixed to the first supporting frame 130*a*. The first strip magazine 50*a* may be fixed between the second upper plate fixing portion 138*b* and the first support frame 130*a* such that the movement of the first strip magazine is limited in the vertical direction (Z direction) and the first strip magazine 50*a* is stably fixed on the first support frame 130*a*.

The second vertical plate 134*b* may support the second side wall plate 52*b* of the second strip magazine 50*b*. The second vertical plate 134*b* may include a first upper plate fixing portion 138*a* for pressing and fixing the upper plate 54 of the second strip magazine 50*b*.

The first upper plate fixing portion 138*a* may press the upper plate 54 of the second strip magazine 50*b* in the vertical direction (Z direction) by protruding from the second vertical plate 134*b* in the second horizontal direction (Y direction). The first upper plate fixing portion 138*a* may include the protruding shape or member extending toward the second strip magazine and may securely support the second strip magazine 50*b* through the protruding shape.

The second strip magazine 50*b* may be fixed between the first upper plate fixing portion 138*a* and the second horizontal plate 132*b* such that the movement of the second strip magazine 50*b* is limited in the vertical direction (Z direction) and the second strip magazine 50*b* is stably fixed on the second support frame 130*b*.

Figure 10:
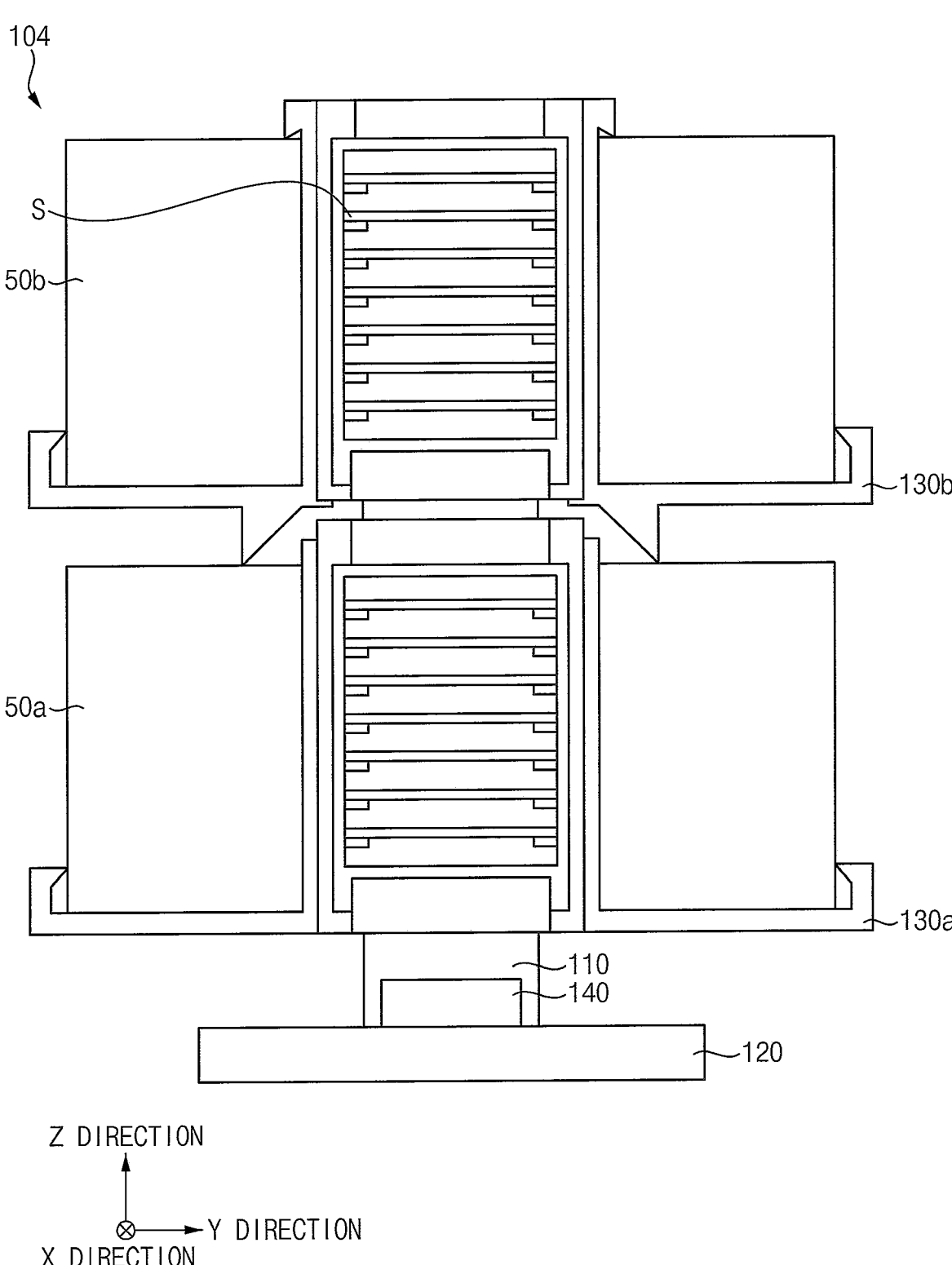
Figure 11:
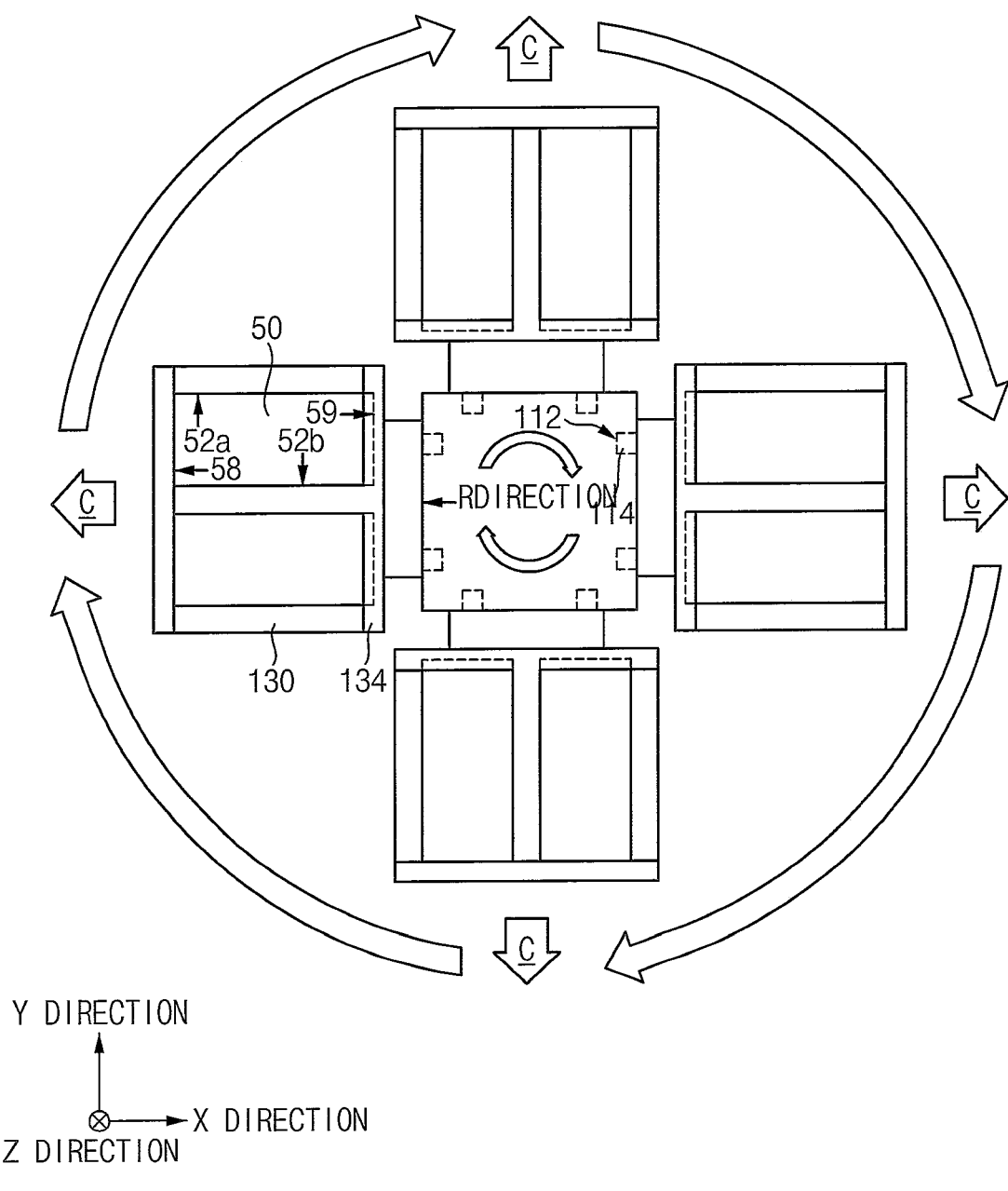

FIG. 10 is a front view illustrating a rotational support mechanism having support frames in a modified arrangement in accordance with example embodiments. FIG. 11 is a plan view illustrating the rotation support mechanism in FIG. 10. The semiconductor substrate processing apparatus may be substantially the same as or similar to the semiconductor substrate processing apparatus described with reference to FIGS. 1 to 9 except for a configuration of the support frames. Thus, same or similar components are denoted by the same or similar reference numerals, and repeated descriptions of the same components may be omitted in the interest of brevity.

Referring to FIGS. 10 and 11, a rotation support mechanism 104 may include the shaft 110, the motor 120 configured to rotate the shaft 110, and the plurality of support frames 130 that are respectively detachably fixed to side surfaces of the shaft 110 and fixedly support the strip magazines 50 provided with the substrates S respectively.

In example embodiments, the strip magazine 50 may include an open end through which the substrate is loaded or unloaded. The open ends may be provided on the front side 58 and the rear side 59 of the strip magazine 50. The plurality of support frames 130 may be positioned the strip magazine 50 on the shaft 110 such that the open end of the strip magazine faces a radial direction (R direction) with respect to a rotation center or axis of rotation of the shaft 110. When the shaft 110 rotates, the centrifugal force C may be generated in the radial direction (R direction). Since the open end of the strip magazine 50 is positioned to face the radial direction (R direction) of the shaft 110, the foreign substances on the substrate S provided in the strip magazine 50 may be discharged from the open end to the outside of the strip magazine 50 through the centrifugal force C. In this case, the semiconductor substrate processing apparatus 10 may increase a cleaning rate of the substrate S.

The number of the support frames 130 may be within a range of 4 to 8 along a circumferential direction with respect to the rotation center of the shaft 110. The plurality of strip magazines 50 may be respectively provided on the plurality of support frames 130. The number of the strip magazines 50 may be within a range of 4 to 8 along the circumferential direction with respect to the rotation center of the shaft 110.

As described above, the rotation support mechanism 100 in the chamber 20 may rotate the strip magazine 50 provided with the substrates S, and may provide the centrifugal force C to the strip magazine 50. The centrifugal force C may physically remove the foreign substances remaining on the substrate S. The foreign substances having a high mass may move toward an edge of the substrate S through the centrifugal force C, and the substrate S may obtain a physical cleaning effect. In addition, the rotation support mechanism 100 may rotate the strip magazine 50 to evenly apply the ions of the plasma P on the substrate S and increase a chemical cleaning effect.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present disclosure. Accordingly, all such modifications are intended to be included within the scope of example embodiments as defined in the claims.

What is claimed is:

1. A semiconductor substrate processing apparatus, comprising:

a chamber dimensioned to accommodate a plurality of strip magazines, each strip magazine configured to receive a plurality of substrates therein;

a plasma generator coupled to the chamber and configured to generate plasma used to remove foreign substances on the substrates in the chamber; and a rotation support mechanism configured to rotate the plurality of strip magazines within the chamber, wherein each of the strip magazines includes first and second side wall plates facing each other, an upper plate and a lower plate, and a plurality of guides on inner sides of the first and second side wall plates to support the substrates disposed between the first and second side wall plates, and wherein the rotation support mechanism includes:

a shaft extending in a vertical direction in the chamber;

a motor configured to rotate the shaft; and a plurality of support frames detachably fixed to side surfaces of the shaft and configured to fixedly support the strip magazines.

2. The semiconductor substrate processing apparatus of claim 1, wherein the shaft comprises a keyway in each of the side surfaces, and each of the support frames comprises a key that is configured to engage with a corresponding one of the keyways of the shaft.

3. The semiconductor substrate processing apparatus of claim 1, wherein each of the support frames includes:

a horizontal plate configured to support the lower plate of the strip magazine and including a side wall plate fixing portion configured to press and fix one of the first and second side wall plates of the strip magazine; and a vertical plate extending from the horizontal plate and configured to support the other one of the first and second side wall plates of the strip magazine and including an upper plate fixing portion configured to press and fix the upper plate of the strip magazine.

4. The semiconductor substrate processing apparatus of claim 1, wherein the support frames include first and second support frames that are spaced apart from each other in a vertical direction along the shaft, a lower surface of the first support frame is spaced apart from the motor by a first distance, and a lower surface of the second support frame is spaced apart from the motor by a second distance greater than the first distance.

5. The semiconductor substrate processing apparatus of claim 4, wherein the first support frame is configured to fix a first strip magazine of the plurality of strip magazines, the first support frame includes a first horizontal plate configured to support the lower plate of the first strip magazine and including a first side wall plate fixing portion configured to press and fix one of the first and second side wall plates of the first strip magazine, and a first vertical plate configured to support the other one of the first and second side wall plates of the first strip magazine, the second support frame is configured to fix a second strip magazine of the plurality of strip magazines, and the second support frame includes a second horizontal plate configured to support the lower plate of the second strip magazine and including a second side wall plate fixing portion configured to press and fix one of the first and second side wall plates of the second strip magazine and a second upper plate fixing portion configured to press and fix the upper plate of the first strip magazine fixed to the first support frame, and a second vertical plate configured to support the other one of the first and second side wall plates of the second strip magazine and including a first upper plate fixing portion configured to press and fix the upper plate of the second strip magazine.

6. The semiconductor substrate processing apparatus of claim 1, wherein the rotation support mechanism further includes a bearing provided between the shaft and the motor to transmit a rotational force generated by the motor to the shaft.

7. The semiconductor substrate processing apparatus of claim 1, wherein the motor is configured to rotate the shaft within a rotation speed range of 1,200 rpm to 2,500 rpm.

8. The semiconductor substrate processing apparatus of claim 1, wherein the motor includes a direct drive motor.

9. The semiconductor substrate processing apparatus of claim 1, wherein each strip magazine includes an open end into which the substrates are loaded or unloaded, and the open end of the strip magazine is configured to face radially with respect to an axis of rotation of the shaft.

10. The semiconductor substrate processing apparatus of claim 9, wherein the number of the strip magazines is within a range of 4 to 8.

11. A semiconductor substrate processing apparatus, comprising:

a chamber dimensioned to provide a space in which a plasma cleaning process is performed;

a motor on a lower wall of the chamber;

a shaft rotatably connected to the motor and extending in a vertical direction in the chamber;

a plurality of support frames detachably fixed to side surfaces of the shaft and fixedly supporting a plurality of strip magazines each loaded with a plurality of substrates; and a plasma generator configured to generate plasma in the chamber for removing foreign substances on the substrates, wherein each of the strip magazines includes first and second side wall plates facing each other, an upper plate and a lower plate, and a plurality of guides on inner sides of the first and second side wall plates to support the substrates between the first and second side wall plates, and each of the strip magazines includes an open end into which the substrates are inserted or removed, and the open end of the strip magazine faces a direction parallel to or perpendicular to the side surface of the shaft to which the support frame supporting the strip magazine is fixed.

12. The semiconductor substrate processing apparatus of claim 11, wherein the shaft includes a keyway in the side surface, and each of the support frames includes a key that engages with the keyway of the shaft.

13. The semiconductor substrate processing apparatus of claim 11, wherein each of the support frames includes:

a horizontal plate supporting the lower plate of the strip magazine and including a side wall plate fixing portion pressing and fixing one of the first and second side wall plates of the strip magazine; and a vertical plate extending from the horizontal plate supporting the other one of the first and second side wall plates of the strip magazine and including an upper plate fixing portion pressing and fixing the upper plate of the strip magazine.

14. The semiconductor substrate processing apparatus of claim 11, wherein the support frames include first and second support frames that are spaced apart from each other in a vertical direction along the shaft, a lower surface of the first support frame is spaced apart from the motor by a first distance, and a lower surface of the second support frame is spaced apart from the motor by a second distance greater than the first distance.

15. The semiconductor substrate processing apparatus of claim 14, wherein the first support frame fixes a first strip magazine of the plurality of strip magazines, the first support frame includes a first horizontal plate supporting the lower plate of the first strip magazine and including a first side wall plate fixing portion pressing and fixing one of the first and second side wall plates of the first strip magazine, and a first vertical plate supporting the other one of the first and second side wall plates of the first strip magazine, the second support frame fixes a second strip magazine of the plurality of strip magazines, and the second support frame includes a second horizontal plate supporting the lower plate of the second strip magazine and including a second side wall plate fixing portion pressing and fixing one of the first and second side wall plates of the second strip magazine and a second upper plate fixing portion pressing and fixing the upper plate of the first strip magazine fixed to the first support frame, and a second vertical plate supporting the other one of the first and second side wall plates of the second strip magazine and including a first upper plate fixing portion pressing and fixing the upper plate of the second strip magazine.

16. The semiconductor substrate processing apparatus of claim 11, wherein the motor is configured to rotate the shaft within a rotation speed range of 1,200 rpm to 2,500 rpm.

17. The semiconductor substrate processing apparatus of claim 11, wherein the motor includes a direct drive motor.

18. The semiconductor substrate processing apparatus of claim 11, wherein the open end of the strip magazine faces radially outwardly with respect to a rotation center of the shaft.

19. The semiconductor substrate processing apparatus of claim 18, wherein the number of the strip magazines is within a range of 4 to 8 along a circumferential direction with respect to the rotation center of the shaft on the support frames.

20. A semiconductor substrate processing apparatus, comprising:

a chamber configured to provide a space for accommodating a plurality of strip magazines that each accommodate a plurality of substrates therein;

a plasma generator configured to generate a plasma for removing foreign substances on the substrates in the chamber; and a rotation support mechanism configured to rotate the strip magazines within the chamber such that ions of the plasma are uniformly applied on the substrates, wherein each of the strip magazines includes first and second side wall plates facing each other, an upper plate and a lower plate, and a plurality of guides on inner sides of the first and second side wall plates to support the substrates loaded between the first and second side wall plates, and wherein the rotation support mechanism includes:

a shaft extending vertically within the chamber and including at least one keyway on a side surface of the shaft;

a motor configured to rotate the shaft;

a bearing provided between the shaft and the motor to transmit a rotational force generated from the motor to the shaft; and at least one support frame fixed to the side surface of the shaft, fixedly supporting each of the strip magazines, and including a key for connecting to or disconnecting from the at least one keyway.

\* \* \* \* \*